US007641321B2

(12) United States Patent
Takahashi

(10) Patent No.: US 7,641,321 B2
(45) Date of Patent: Jan. 5, 2010

(54) METHOD OF MANUFACTURING LIQUID EJECTION HEAD AND IMAGE FORMING APPARATUS

(75) Inventor: Shuji Takahashi, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 277 days.

(21) Appl. No.: 11/902,332

(22) Filed: Sep. 20, 2007

(65) Prior Publication Data

US 2008/0074472 A1 Mar. 27, 2008

(30) Foreign Application Priority Data

Sep. 22, 2006 (JP) ............................ 2006-257800

(51) Int. Cl.
*B41J 2/045* (2006.01)
*H01L 41/22* (2006.01)
*H04R 17/00* (2006.01)

(52) U.S. Cl. ....................................... 347/68; 29/25.35

(58) Field of Classification Search .................. 347/68, 347/69-72; 400/126.16, 124.17; 310/363-366, 310/324, 328

See application file for complete search history.

(56) References Cited

U.S. PATENT DOCUMENTS

| | | | | |
|---|---|---|---|---|
| 6,502,930 B1 | | 1/2003 | Shimada et al. | |
| 2002/0149652 | A1* | 10/2002 | Sakamoto et al. | 347/68 |
| 2006/0061631 | A1* | 3/2006 | Yokouchi | 347/68 |
| 2006/0066689 | A1* | 3/2006 | Hori | 347/68 |
| 2007/0024676 | A1* | 2/2007 | Kachi et al. | 347/68 |

FOREIGN PATENT DOCUMENTS

JP 2001-191542 A 7/2001

* cited by examiner

*Primary Examiner*—K. Feggins
(74) *Attorney, Agent, or Firm*—Birch, Stewart, Kolasch & Birch, LLP

(57) ABSTRACT

The method of manufacturing a liquid ejection head includes the steps of: forming a groove section in a first layer of a substrate including at least the first layer and a second layer, the groove section having a bottom face constituted by the second layer and being formed in a ring shape; forming a protective film on the groove section; forming a diaphragm on a surface of the first layer where the groove section is opened; forming a piezoelectric element on the diaphragm; forming an opening section in the diaphragm so as to expose a portion of a region of the first layer surrounded by the groove section; and etching the first layer via the opening section so as to form a pressure chamber, using the second layer as an etching stop layer.

7 Claims, 11 Drawing Sheets

METHOD OF MANUFACTURING LIQUID EJECTION HEAD AND IMAGE FORMING APPARATUS

BACKGROUND OF THE INVENTION

1. Field of the Invention

The present invention relates to a method of manufacturing a liquid ejection head, and an image forming apparatus, and more particularly, to a method of manufacturing a liquid ejection head and an image forming apparatus by which an ink droplet is ejected from a nozzle by applying a pressure change to liquid inside a pressure chamber by means of the displacement of a piezoelectric element formed on a diaphragm.

2. Description of the Related Art

Inkjet recording apparatuses perform recording by ejecting ink droplets from nozzles onto a recording medium, while moving a recording head having a plurality of nozzles and a recording medium relatively with respect to each other, and they have come into broad use due to their low noise during the recording operation, their low running costs, and the fact that they enable images of high quality to be recorded onto recording media of various different types. The recording head comprises pressure chambers corresponding respectively to the nozzles, ink flow channels and other components. For example, an ink droplet is ejected from a nozzle connected to a pressure chamber by applying a pressure change to the ink inside the pressure chamber by using a pressure generating device, such as a piezoelectric element, or a heat generating element.

Until now, various methods of manufacturing a recording head have been proposed. For example, Japanese Patent Application Publication No. 2001-191542 discloses a method of manufacturing a recording head which uses a silicon substrate. Japanese Patent Application Publication No. 2001-191542 describes a method in which recess sections are previously formed in the surface of a silicon substrate, these recess sections are buried by $SiO_2$ or the like forming a sacrificial layer, the surface of this layer is leveled and piezoelectric devices are formed by patterning, whereupon the sacrificial layer is removed to obtain pressure chambers. Japanese Patent Application Publication No. 2001-191542 identifies as problems relating to such a method, the large time requirement needed in order to deposit the sacrificial layer, the difficulties in leveling the sacrificial layer, and cost issues. According to Japanese Patent Application Publication No. 2001-191542, in order to resolve these problems, a portion of the surface of the silicon substrate is etched in such a manner that a plurality of column-shaped portions remain, the chemical properties of the plurality of column-shaped portions are modified and a portion of the surface is leveled, a diaphragm and piezoelectric elements are formed on the leveled portion of the surface, and the plurality of column-shaped portions having modified chemical properties are then removed by etching.

However, in the method of manufacture described in Japanese Patent Application Publication No. 2001-191542, the column-shaped portions formed in the prescribed regions of the silicon substrate (the pressure chamber and ink supply port forming portions) are removed by wet etching with HF (hydrofluoric acid) after forming the diaphragm and piezoelectric elements. The column-shaped portions are formed by creating groove sections by etching of the silicon, followed by thermal oxidation, and therefore undulations occur in the bottom face of the pressure chambers and the ejection characteristics are degraded. Furthermore, due to differences in the aspect ratio when forming the groove sections, micro-loading effects occur due to the difference in etching depth (etching rate), and this is liable to give rise to surface irregularities (undulations) and non-uniform depth of the pressure chambers, leading to variation in the ejection characteristics between the nozzles. Accordingly, there is a possibility that the quality of the recorded image may decline.

SUMMARY OF THE INVENTION

The present invention has been contrived in view of the aforementioned circumstances, an object thereof being to provide a method of manufacturing a liquid ejection head, and an image forming apparatus, whereby a piezoelectric element and a pressure chamber can be formed with high accuracy.

In order to attain the aforementioned object, the present invention is directed to a method of manufacturing a liquid ejection head, comprising the steps of: forming a groove section in a first layer of a substrate including at least the first layer and a second layer, the groove section having a bottom face constituted by the second layer and being formed in a ring shape; forming a protective film on the groove section; forming a diaphragm on a surface of the first layer where the groove section is opened; forming a piezoelectric element on the diaphragm; forming an opening section in the diaphragm so as to expose a portion of a region of the first layer surrounded by the groove section; and etching the first layer via the opening section so as to form a pressure chamber, using the second layer as an etching stop layer.

In this aspect of the present invention, the diaphragm and the piezoelectric element are formed before forming the pressure chamber, and therefore it is possible to form the piezoelectric element with good accuracy, even if the diaphragm is thin. In addition, when forming the pressure chamber by means of etching, since the second layer acts as an etching stop layer, there are no irregularities in the surface of the pressure chamber, and furthermore, since the outline shape of the pressure chamber is defined with good accuracy by means of the groove section formed in the first layer before forming the diaphragm, then it is possible to form the pressure chamber with good accuracy.

Preferably, the substrate is an SOI substrate.

In this aspect of the present invention, desirably, an SOI substrate is used as the substrate which forms the pressure chamber. The depth of the pressure chamber can be set freely in accordance with the thickness of the layer in which the groove section is formed, and furthermore, handling characteristics are also improved.

Preferably, the protective film and the diaphragm are made of a same material.

In this aspect of the present invention, it is possible to form the protective film and the diaphragm simultaneously, in the same film deposition step, and therefore the manufacturing process can be condensed.

Preferably, a sectional shape of the groove section parallel to a depth direction of the groove section is a tapered shaped which narrows in width from an opening side of the groove section toward a bottom face side of the groove section.

In this aspect of the present invention, the coverage when forming the protective film on the groove section is improved.

Preferably, a sectional shape of the groove section parallel to a depth direction of the groove section comprises a radius-shaped end portion on at least one of an opening side and a bottom face side of the groove section.

In this aspect of the present invention, the air bubble removal characteristics of the pressure chamber are improved.

Preferably, the method of manufacturing a liquid ejection head further comprises the step of forming a heater electrode in the groove section.

In this aspect of the present invention, a heater electrode is formed in the groove section formed following the outline shape of the pressure chamber, and therefore it is possible to adjust the temperature of the pressure chamber.

In order to attain the aforementioned object, the present invention is also directed to an image forming apparatus comprising the liquid ejection head manufactured by any one of the above-mentioned methods of manufacturing a liquid ejection head.

According to the present invention, the diaphragm and the piezoelectric element are formed before forming the pressure chamber, and therefore it is possible to form the piezoelectric element with good accuracy, even if the diaphragm is thin. In addition, when forming the pressure chamber by means of etching, since the second layer acts as an etching stop layer, there are no irregularities in the surface of the pressure chamber, and furthermore, since the outline shape of the pressure chamber is defined with good accuracy by means of the groove section formed in the first layer before forming the diaphragm, then it is possible to form the pressure chamber with good accuracy.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein.

DETAILED DESCRIPTION OF THE PREFERRED EMBODIMENTS

First Embodiment

Firstly, an inkjet recording apparatus which is one embodiment of the image forming apparatus according to the present invention is described below.

Figure 1:
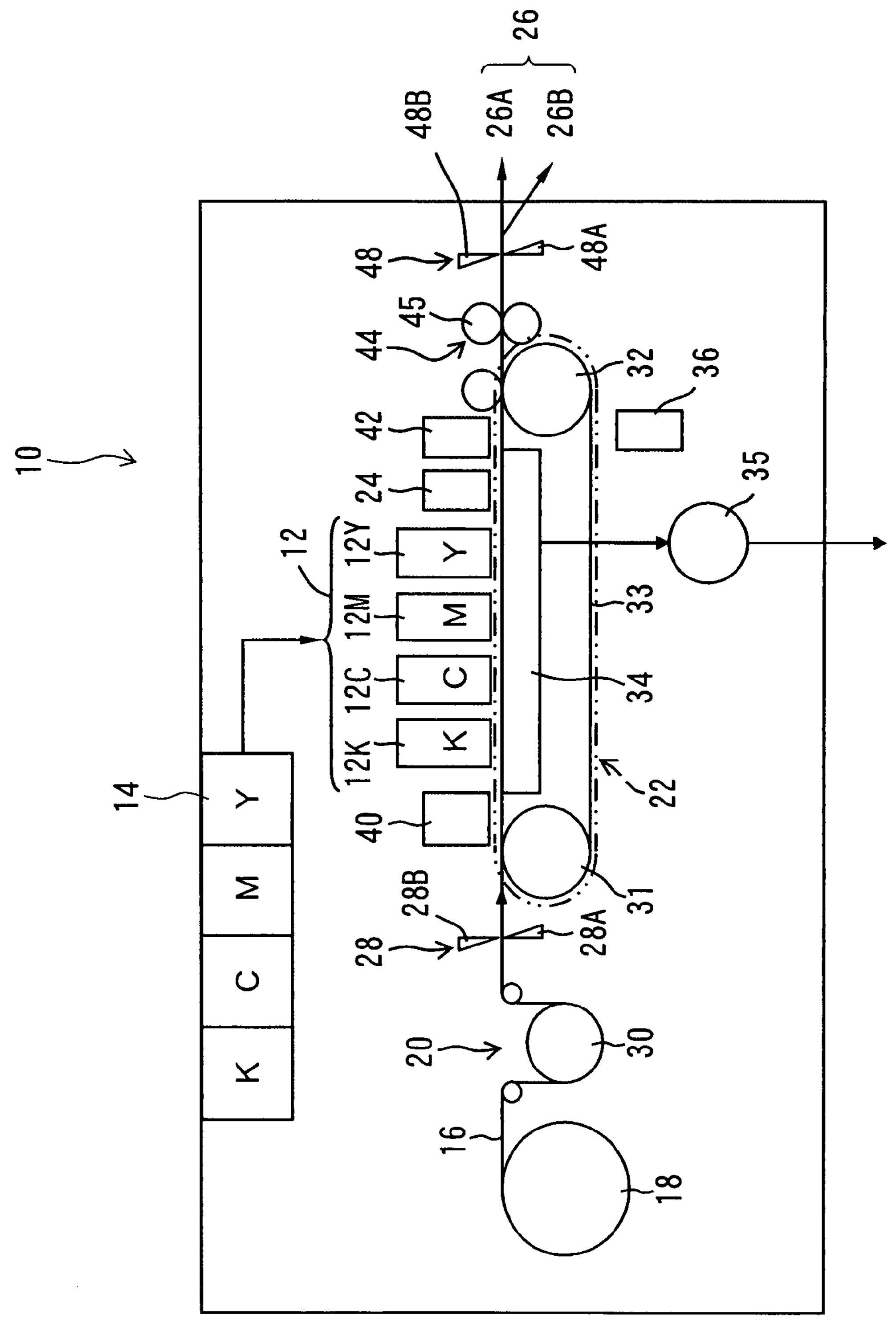
FIG. 1 is a general schematic drawing showing a general view of an inkjet recording apparatus.

FIG. 1 is a general schematic drawing showing an approximate general view of the inkjet recording apparatus. As shown in FIG. 1, the inkjet recording apparatus 10 comprises: a printing unit 12 having a plurality of recording heads 12K, 12C, 12M, and 12Y for ink colors of black (K), cyan (C), magenta (M), and yellow (Y), respectively; an ink storing and loading unit 14 for storing inks of K, C, M and Y to be supplied to the recording heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet ejection face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a magazine for rolled paper (continuous paper) is shown as an example of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of the configuration in which roll paper is used, a cutter 28 is provided as shown in FIG. 1, and the continuous paper is cut into a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyor pathway. When cut papers are used, the cutter 28 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite to the curl direction in the magazine. In this, the heating temperature is preferably controlled in such a manner that the medium has a curl in which the surface on which the print is to be made is slightly rounded in the outward direction.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a plane.

The belt 33 has a width that is greater than the width of the recording paper 16, and a plurality of suction restrictors (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1; and a negative pressure is generated by sucking air from the suction chamber 34 by means of a fan 35, thereby the recording paper 16 on the belt 33 is held by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, examples thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different than that of the belt 33 to improve the cleaning effect.

The inkjet recording apparatus 10 can comprise a roller nip conveyance mechanism, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

The print unit 12 is a so-called "full line head" in which a line head having a length corresponding to the maximum paper width is arranged in a direction (main scanning direction) that is perpendicular to the paper conveyance direction (sub-scanning direction). The recording heads 12K, 12C, 12M and 12Y forming the print unit 12 are constituted by line heads in which a plurality of ink ejection ports (nozzles) are arranged through a length exceeding at least one edge of the maximum size recording paper 16 intended for use with the inkjet recording apparatus 10.

The recording heads 12K, 12C, 12M, and 12Y corresponding to respective ink colors are disposed in the order, black (K), cyan (C), magenta (M) and yellow (Y), from the upstream side (left-hand side in FIG. 1), following the direction of conveyance of the recording paper 16 (the paper conveyance direction). A color print can be formed on the recording paper 16 by ejecting the inks from the recording heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relative to each other in the paper conveyance direction (sub-scanning direction) just once (in other words, by means of a single sub-scan). Higher-speed printing is thereby made possible and productivity can be improved in comparison with a shuttle type head configuration in which a recording head moves reciprocally in a direction (main-scanning direction) that is perpendicular to the paper conveyance direction.

Although the configuration with the KCMY four standard colors is described in the present embodiment, combinations of the ink colors and the number of colors are not limited to those. Light inks or dark inks can be added as required. For example, a configuration is possible in which recording heads for ejecting light-colored inks such as light cyan and light magenta are added.

As shown in FIG. 1, the ink storing and loading unit 14 has ink tanks for storing the inks of the colors corresponding to the respective recording heads 12K, 12C, 12M, and 12Y, and the respective tanks are connected to the recording heads 12K, 12C, 12M, and 12Y by means of channels (not shown). The ink storing and loading unit 14 has a warning device (for example, a display device or an alarm sound generator) for warning when the remaining amount of any ink is low, and has a mechanism for preventing loading errors among the colors.

The print determination unit 24 has an image sensor (line sensor and the like) for capturing an image of the ink-droplet deposition result of the printing unit 12, and functions as a device to check for ejection defects such as clogs of the nozzles in the printing unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the recording heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern image printed by the recording heads 12K, 12C, 12M, and 12Y for the respective colors, and the ejection of each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substances that cause dye molecules to break down, and has the effect of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in the drawings, the paper output unit 26A for the target prints is provided with a sorter for collecting prints according to print orders.

The recording heads 12K, 12C, 12M and 12Y provided for the respective ink colors have the same structure, and a reference numeral 50 is hereinafter designated to a representative example of these recording heads.

Figure 2:
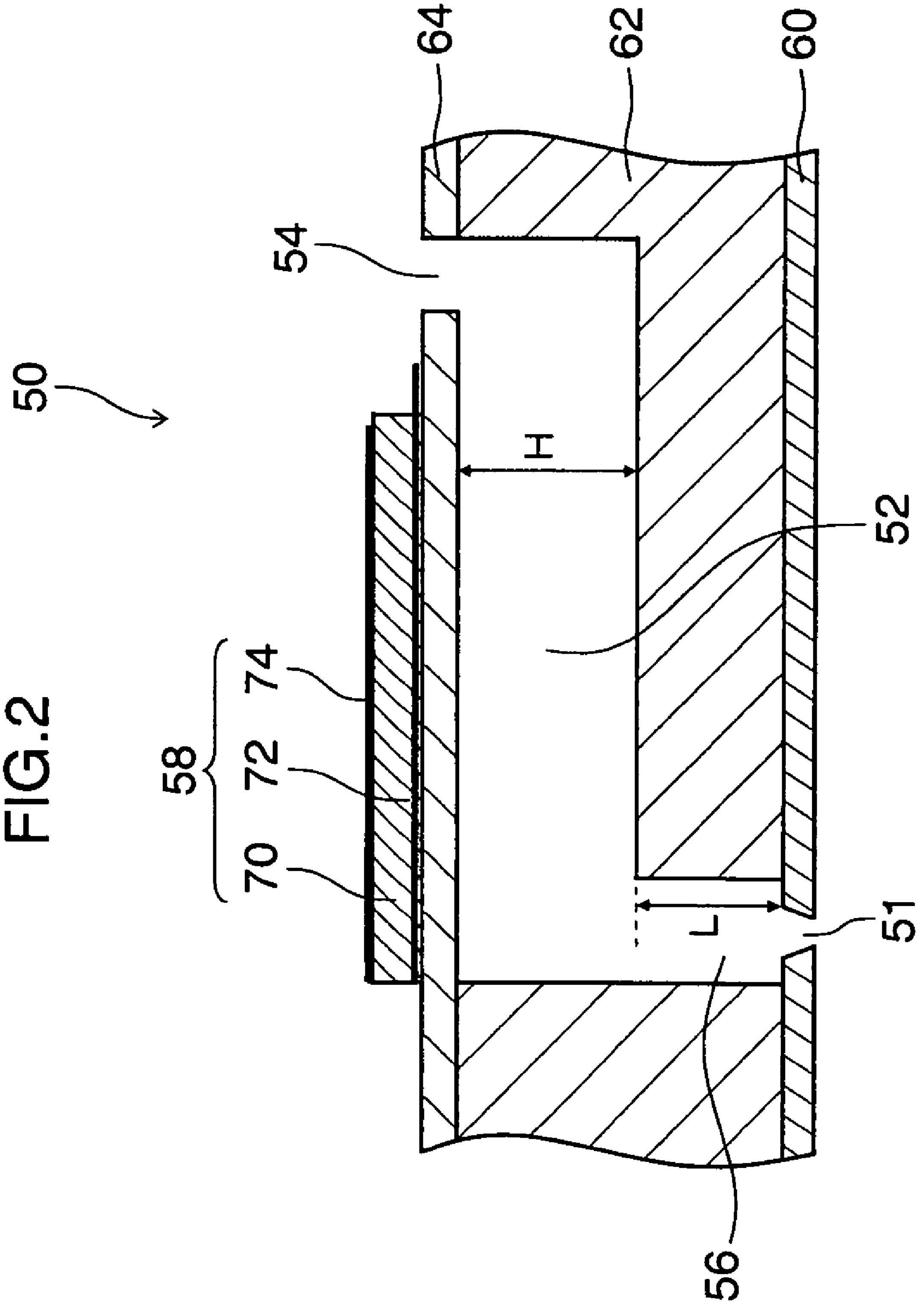
FIG. 2 is a cross-sectional diagram showing an approximate view of a portion of a recording head.

Next, the composition of a recording head 50 is described below. FIG. 2 is a cross-sectional diagram showing an approximate view of a portion of a recording head 50. As shown in FIG. 2, the recording head 50 is constituted by a nozzle plate 60, a flow channel substrate 62 and a diaphragm 64, which are successively stacked. The detailed composition of the recording head 50 is described hereinafter, but the flow channel substrate 62 is constituted by an SOI substrate (a substrate having a three-layer structure) comprising a supporting layer (Si), a box layer ($SiO_2$), and an active layer (Si).

Although not shown in the drawings, a plurality of ejection ports (nozzles) 51 are formed in a two-dimensional (matrix) configuration in the nozzle plate 60, and as shown in FIG. 2, each nozzle 51 is connected via a nozzle flow channel 56 to a corresponding pressure chamber 52. The pressure chambers 52 are composed by sealing the upper surface of groove sections formed in the flow channel substrate 62, by means of a diaphragm 64, and ink that is to be ejected from the nozzles 51 is filled into the pressure chambers 52. Supply ports 54 for supplying ink to the respective pressure chambers 52 are formed in the diaphragm 64, and ink is supplied to the pressure chambers 52 via these supply ports 54, from an ink tank (not illustrated) which forms an ink supply source.

Piezoelectric elements 58 are provided on the diaphragm 64 at positions corresponding to the pressure chambers 52 (in other words, at positions opposing the pressure chambers 52 via the diaphragm 64). Each of the piezoelectric elements 58 is composed by sandwiching a piezoelectric body 70, typically a piezo element, between electrodes (a common electrode 72 and an individual electrode 74) provided on either surface thereof.

By means of this composition, when a prescribed drive signal is supplied to a piezoelectric element 58, the volume of the pressure chamber 52 changes due to deformation of the diaphragm 64 caused by displacement of the piezoelectric element 58, thereby pressurizing the ink inside the pressure chamber 52 and causing an ink droplet to be ejected from the nozzle 51 connected to the pressure chamber 52.

Next, a method of manufacturing a recording head 50 of this kind is described below. FIGS. 3A to 5F are illustrative diagrams showing steps for manufacturing a recording head. Below, each of the steps is described in detail with reference to these diagrams.

Figure 3A:
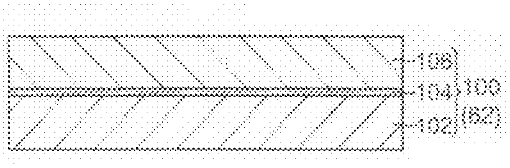
FIGS. 3A to 3J are illustrative diagrams showing steps of manufacturing a recording head according to a first embodiment of the invention.

Firstly, as shown in FIG. 3A, an SOI substrate (three-layer structure substrate) 100, comprising a supporting layer (Si) 102, a box layer ($SiO_2$) 104 and an active layer (Si) 106, is prepared. The SOI substrate 100 corresponds to the flow channel substrate 62 in FIG. 2. The thickness of the SOI substrate 100 is 50 to 500 (μm), and the thicknesses of the respective layers are, for example, 100 μm in the supporting layer 102, 1 μm in the box layer 104 and 100 μm in the active layer 106. The thickness of the active layer 106 corresponds to the depth H of the pressure chambers 52, and the thickness of the supporting layer 102 and the box layer 104 corresponds to the length L of the nozzle flow channel 56 (see FIG. 2). The thicknesses of the respective layers should be decided in accordance with the shape of the pressure chambers 52 and the nozzle flow channels 56.

Figure 3B:
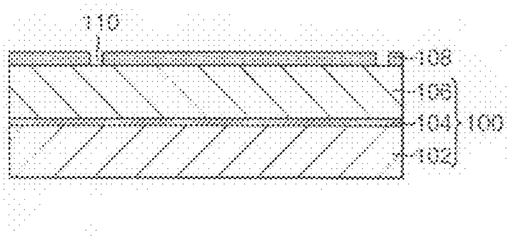

Thereupon, as shown in FIG. 3B, patterning of a resist (photosensitive resin) 108 is carried out onto the upper surface of the SOI substrate 100 (the side of the active layer 106). More specifically, the following processes are carried out in sequence on the whole surface of the active layer 106: resist coating, pre-baking, exposure, development, and post-baking. The various process conditions should be decided in accordance with the type and thickness of the resist. Desirably, the thickness of the resist 108 is decided in accordance with the selection ratio of the silicon etching carried out in the subsequent step. Instead of such a resist 108, it is also possible to use a hard mask made of an oxide film, a nitride film, metal, or the like. The patterning of the resist 108 is carried out in such a manner that ring-shaped opening regions 110 corresponding to the outline shape of the pressure chambers 52 are formed in the resist 108.

Figure 3C:
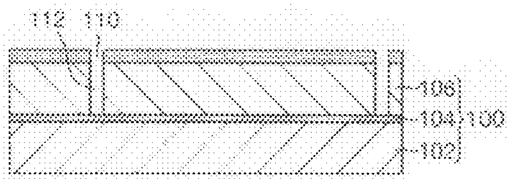
Figure 3D:
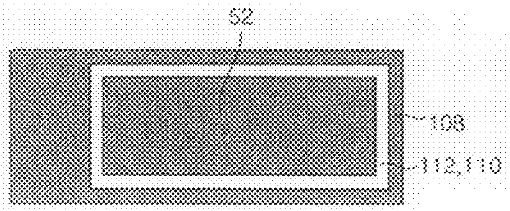
Figure 3E:
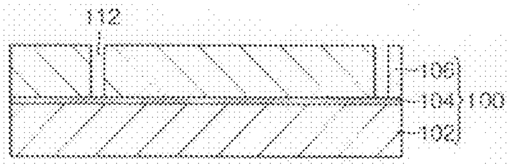

Thereupon, as shown in FIG. 3C, dry etching (trench etching) is carried out on the active layer 106, from the upper surface of the SOI substrate 100, thereby forming trench sections (groove sections) 112 in the active layer 106. The dry etching is carried out, for instance, by a method which involves etching and protective film formation that are carried out repeatedly, or by using a mixed gas of $SF_6$, $C_4F_8$, $O_2$, $CHF_3$, or the like (while forming protective films on the side walls), or the like. In this case, the box layer 104 functions as an etching stop layer, and therefore only the regions of the active layer 106 which are not covered by the resist 108 (in other words, the regions corresponding to the opening regions 110) are removed by etching, and the trench sections 112 with a bottom face constituted by the box layer 104 are formed in the active layer 106. FIG. 3D is a diagram showing the upper surface of the state in FIG. 3C. As shown in FIG. 3D, the planar shape of the trench section 112 is the same as the planar shape of the resist 110, being a ring shape which follows the outline shape of the rectangular pressure chamber 52. After forming the trench sections 112, the resist 108 is removed by means of an ashing process, or by using a special peeling solution. FIG. 3E shows a state after removal of the resist.

Figure 3F:
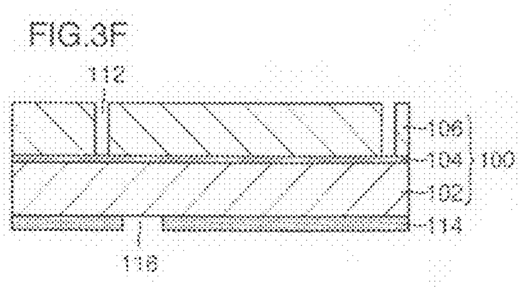

Next, as shown in FIG. 3F, the patterning of a resist 114 is carried out onto the lower surface side (supporting layer 102) of the SOI substrate 100. More specifically, similarly to the method of forming the resist 108 described above (see FIG. 3B), the following processes are carried out in sequence on the whole surface of the supporting layer 102: resist coating, pre-baking, exposure, development, and post-baking. The various process conditions should be decided in accordance with the type and thickness of the resist. Although the planar shape of the resist 114 is not shown in the drawings, the patterning of the resist 114 is carried out in such a manner that opening regions 116 corresponding to nozzle flow channels 56 are formed therein.

Figure 3G:
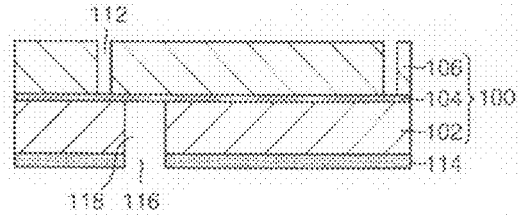
Figure 3H:
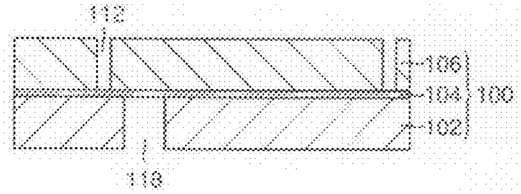

Thereupon, as shown in FIG. 3G, dry etching is carried out on the supporting layer 102 from the lower surface side of the SOI substrate 100, thereby forming groove sections 118 in the supporting layer 102. The dry etching in this step is similar to the dry etching method for the active layer 106 described above (see FIG. 3C), and since the box layer 104 functions as an etching stop layer, then only those regions of the supporting layer 102 which are not covered with the resist 114 (in other words, the regions corresponding to the opening regions 116) are removed by etching. In this way, groove sections 118 having a bottom surface constituted by the box layer 104 are formed in the supporting layer 102. The groove sections 118 correspond respectively to the nozzle flow channels 56 (see FIG. 2). After forming the groove sections 118, the resist 114 is removed by means of an ashing process, or by using a special peeling solution. FIG. 3H shows a state after removal of the resist.

Figure 3I:
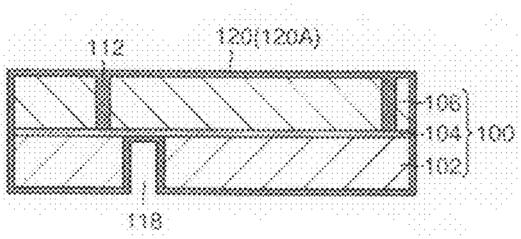
Figure 3J:
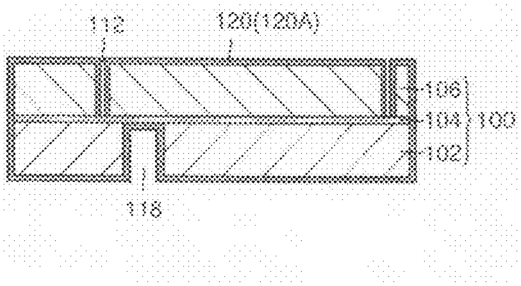
Figure 4A:
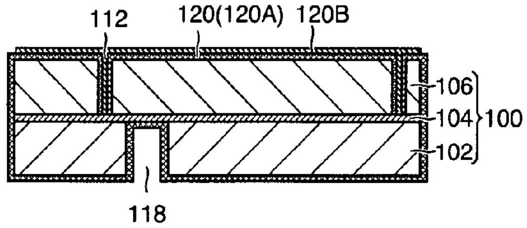
FIGS. 4A to 4J are illustrative diagrams showing steps of manufacturing a recording head according to the first embodiment of the invention.
Figure 4B:
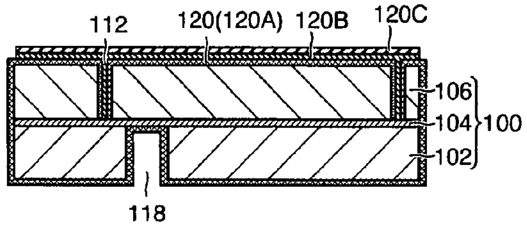

Thereupon, as shown in FIG. 3I, a protective film (oxide film) 120 (120A) is formed over the whole surface of the SOI substrate 100, by thermal oxidation. In this process, the interiors of the trench sections 112 are buried by the protective layer 120A, without leaving any gaps. If a gap is formed inside each trench section 112 as shown in FIG. 3J, then as shown in FIG. 4A, a protective film 120B such as an oxide film or a nitride film, or the like, is formed on the upper surface side of the SOI substrate 100 using a method such as plasma CVD, LPCVD, plasma oxidation, a nitriding process, or the like, in such a manner that the interiors of the trench sections 112 are buried by the protective films 120A and 120B without creating any gaps. In addition, as shown in FIG. 4B, it is also possible to form a protective film 120C on the upper surface of the SOI substrate 100. The method of forming the protective films 120 (120A to 120C) may be, for instance, thermal oxidation, P-CVD, LP-CVD, sputtering, vapor deposition, plasma oxidation, a nitriding process, or the like, and it is also possible to use a combination of these methods. The thickness of the protective film 120 may be set as desired. Below, a case is described in which the protective film 120 is formed as shown in FIG. 3I, but the same applies in the case illustrated in FIGS. 4A and 4B.

Figure 4C:
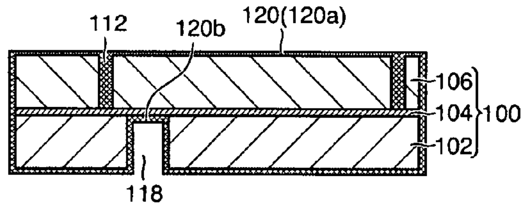
Figure 4D:
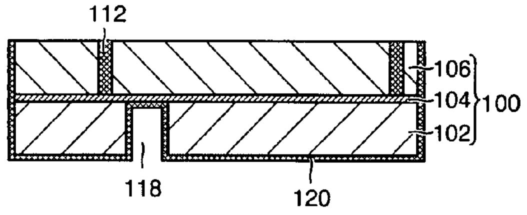

Next, as shown in FIG. 4C, the protective film 120*a* on the upper surface of the SOI substrate 100 (in other words, the surface of the active layer 106) is leveled, according to requirements. Alternatively, as shown in FIG. 4D, the protective film 120*a* on the surface of the active layer 106 may be removed completely by the leveling process. The leveling method may use polishing, CMP, a plasma leveling technique, or the like. Below, a case is described in which leveling is carried out as shown in FIG. 4C, but the same applies to the case shown in FIG. 4D.

Figure 4E:
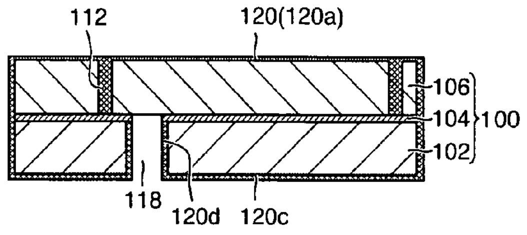

Thereupon, as shown in FIG. 4E, the protective layer 120*b* (see FIG. 4C) and the box layer 104 at the bottom face of the groove sections 118 are removed by dry etching from the lower surface side of the SOI substrate 100. The protective film 120*b* on the bottom face of the groove sections 118 is thinner than the protective film 120*c* on the surface of the supporting layer 102, and therefore an etching selection ratio can be achieved. In this case, the protective layer 120*d* on the side faces of the groove sections 118 is not etched.

Figure 4F:
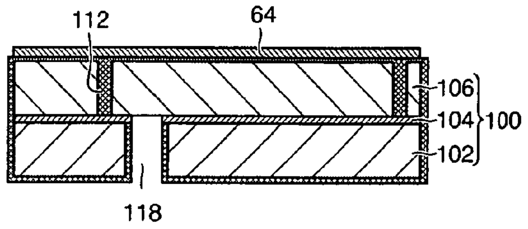
Figure 4G:
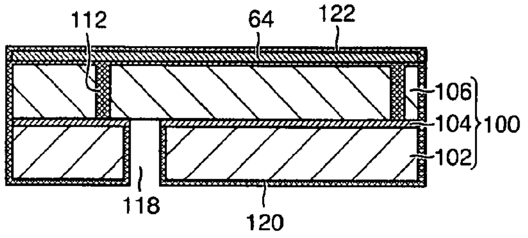

Next, as shown in FIG. 4F, a diaphragm 64 is formed on the upper surface side of the SOI substrate 100 (the side of the active layer 106). More specifically, a diaphragm 64 is formed by depositing Si, $SiO_2$, or the like, by means of sputtering, vacuum deposition, CVD, or the like. The diaphragm 64 can be set to any desired thickness (film thickness). After forming the diaphragm 64, according to requirements, an insulating protective film 122 is formed so as to cover the diaphragm 64, as shown in FIG. 4G For example, a protective film 122 is formed by depositing an oxide film or a nitride film by means of sputtering, vapor deposition, CVD, or another such method. The protective film 122 can be set to a desired thickness.

Figure 6A:
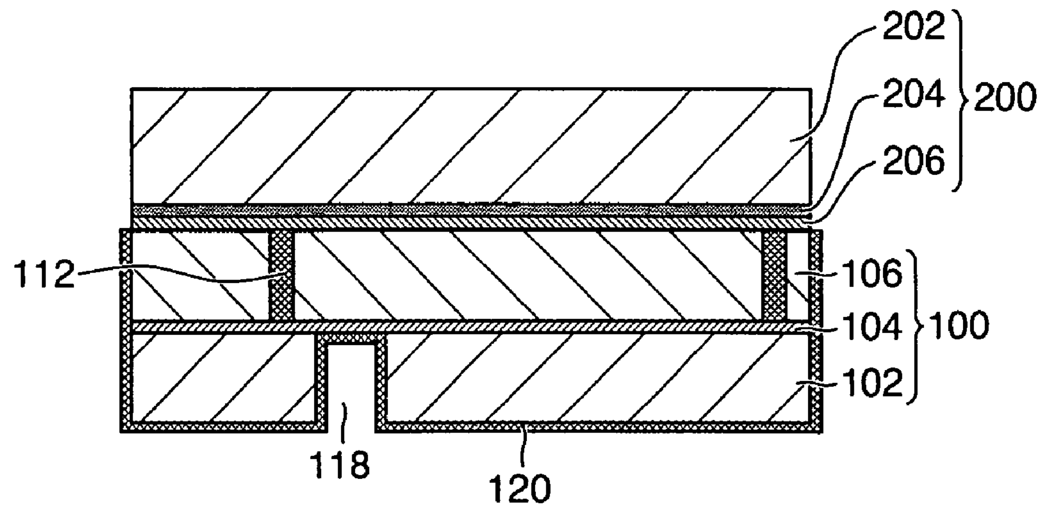
FIGS. 6A and 6B are illustrative diagrams showing a further method of forming a diaphragm.
Figure 6B:
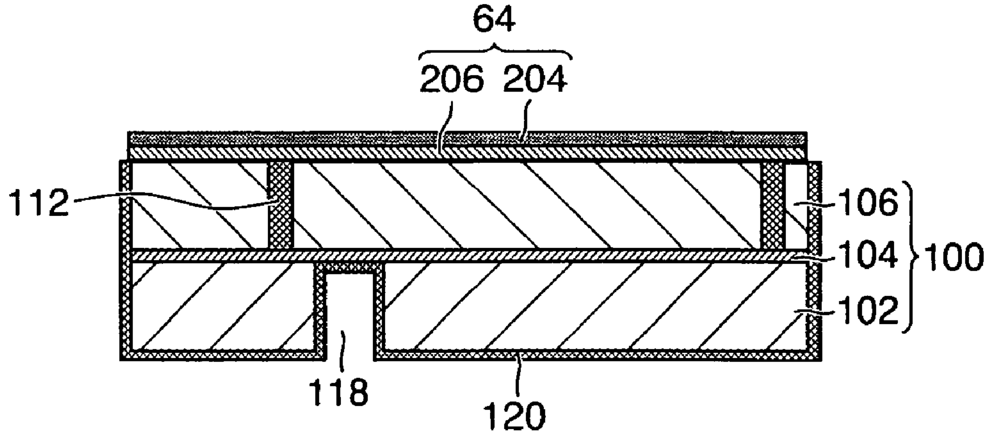

FIGS. 6A and 6B show a further method of forming a diaphragm 64. After leveling the protective film 120*a* on the upper surface of the SOI substrate 100 according to requirements, (see FIG. 4C or 4D), a SOI substrate 200 constituted by a supporting layer (Si) 202, a box layer ($SiO_2$) 204 and an active layer (Si) 206 is bonded to the upper surface side of the SOI substrate 100, as shown in FIG. 6A. In this case, the substrates are bonded together in such a manner that the active layers 106 and 206 face each other. The bonding method adopted may be anodic bonding, diffusion bonding, room-temperature bonding, or the like. Subsequently, by removing the supporting layer 202, the diaphragm 64 including the box layer 204 and the active layer 206 is formed, as shown in FIG. 6B. The method used to remove the supporting layer 202 may be wet etching, dry etching, polishing, CMP, or the like, and it is also possible to use a combination of these methods. Thereupon, similarly to the case shown in FIG. 4G, an insulating protective film 122 should be formed, according to requirements, so as to cover the diaphragm 64.

Figure 4H:
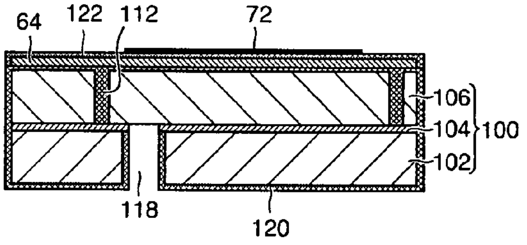
Figure 4I:
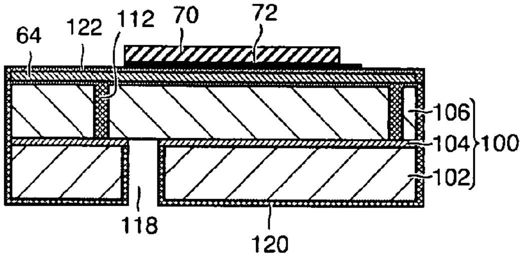
Figure 4J:
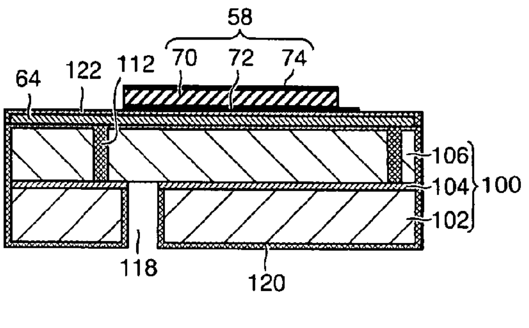

After forming the diaphragm 64 and forming the protective film 122 according to requirements, lower electrodes (common electrode) 72, piezoelectric bodies 70, and upper electrodes (individual electrodes) 74 are formed successively on top of the diaphragm 64 which is covered by the protective film 122, as shown in FIGS. 4H to 4J. These elements may be formed, for example, by sequentially repeating the steps of depositing a prescribed material (an electrode material or piezoelectric material), by sputtering, vapor deposition, CVD, or the like, carrying out patterning of a resist, and then removing the portions not covered by the resist by means of wet etching, dry etching, or the like. In this way, the piezoelectric elements 58 each including a lower electrode 72, a piezoelectric body 70, and an upper electrode 74 that are patterned to a prescribed shape, are formed on the diaphragm 64 (see FIG. 4J).

Figure 5A:
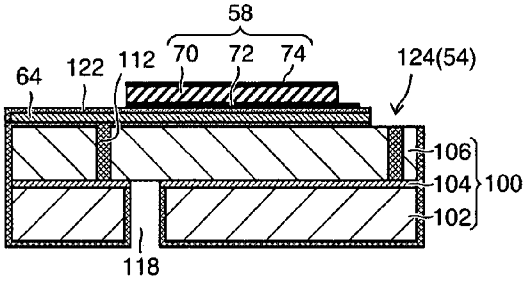
FIGS. 5A to 5F are illustrative diagrams showing steps of manufacturing a recording head according to the first embodiment of the invention.

Thereupon, as shown in FIG. 5A, opening sections 124 are formed in the diaphragm 64, and portions of the inside region of the active layer 106 which are surrounded by the ring-shaped trench sections 112 are exposed. More specifically, by carrying out the following processes in sequence: resist coating, pre-baking, exposure, development, and post-baking, resist of a prescribed shape is patterned onto the diaphragm 64. As a result, the regions which are not covered with the resist, together with the protective films 120 and 122 formed on both surfaces of the diaphragm 64, are removed by dry etching, thereby forming opening sections 124 through which portions of the inside regions of the active layer 106 surrounded by the ring-shaped trench sections 112 are exposed. The opening sections 124 correspond respectively to the supply ports 54 as shown in FIG. 2. For reference purposes, FIG. 5B shows a planar view of the state shown in FIG. 5A.

Figure 5E:
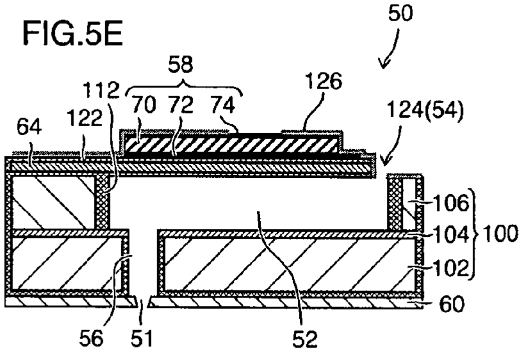
Figure 5B:
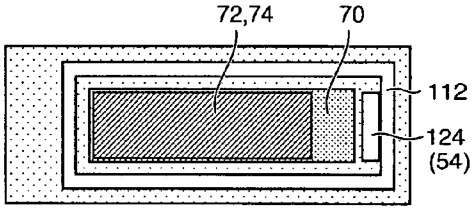
Figure 5F:
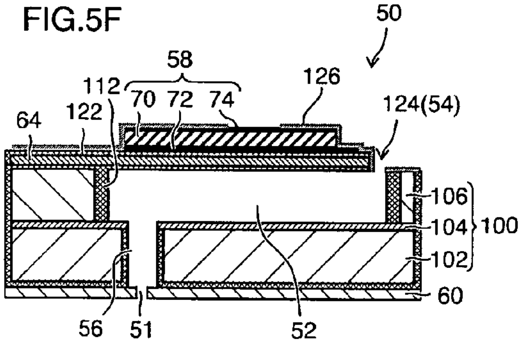
Figure 5C:
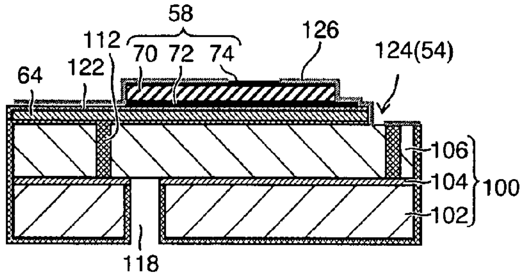

Thereupon, as shown in FIG. 5C, an insulating protective film 126 made of an oxide film, a nitride film, or the like, is deposited by sputtering, vapor deposition, CVD, or the like, onto the upper surface side of the SOI substrate 100, and after patterning a resist thereon, the protective film 126 is patterned to a prescribed shape by dry etching. In this case, the protective film 126 is patterned in such a manner that the diaphragm 64 does not assume an exposed state, whereas portions of the active layer 106 does assume an exposed state, via the opening sections 124 formed in the diaphragm 64. Furthermore, according to need, portions of the electrodes 72 and 74 of the respective piezoelectric elements 58 are exposed in order to form electrical connections.

Figure 5D:
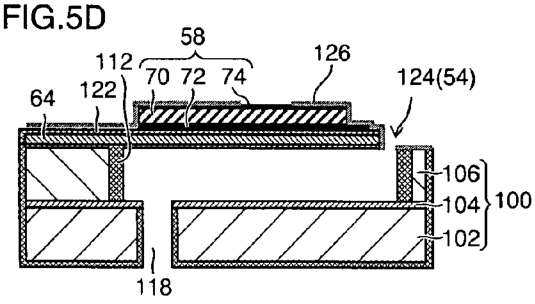

Thereupon, as shown in FIG. 5D, etching is carried out on the active layer 106 via each of the opening sections 124, thereby forming the pressure chambers 52. The etching method used is an anisotropic etching method, for example, plasma etching using $SF_6$ or the like, or gas reaction etching using $XeF_2$, or the like. In this case, since the box layer 104 forms an etching stop layer, the bottom face of the pressure chambers 52 does not have surface irregularities (undulations) and therefore the pressure chambers 52 have a uniform depth. Moreover, the outline shape (side faces) of the pressure chambers 52 is defined accurately by the trench sections 112 buried by the protective film 120, and therefore it is possible to form pressure chambers 52 with high accuracy.

Finally, as shown in FIG. 5E, a separately manufactured nozzle plate 60 is bonded to the lower surface side of the SOI substrate 100. The bonding method used may be anodic bonding, eutectic bonding, normal temperature bonding, welding, or the like. The shape of the nozzles 51 formed in the nozzle plate 60 is not limited to a tapered shape which narrows to a fine tip toward the ink ejection side, as shown in FIG. 5E, and it may, of course, also be a straight shape as shown in FIG. 5F, for example, or another shape (a curved shape, a tapered and straight shape, or the like). In this way, the recording head 50 is completed.

In the present embodiment, the cross-sectional shape of the trench sections 112 is a straight shape (see FIG. 3C), but the implementation of the present invention is not limited to this. For example, the shapes shown in FIG. 7 and FIG. 8 are also possible.

Figure 7:
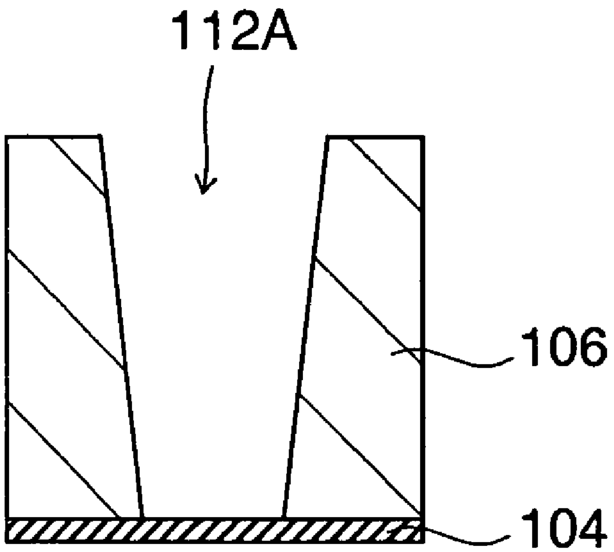
FIG. 7 is an illustrative diagram showing a first modification of the first embodiment.

FIG. 7 is an illustrative diagram showing a first modification of the first embodiment. As shown in FIG. 7, the trench sections 112A according to this modification are formed in a tapered shape which broadens in width toward the opening side. The method of forming these taper-shaped trench sections 112A may be a method in which the silicon is etched by repeating the steps of etching and protective film formation, or a method in which dry etching is carried out by using a mixed gas of $SF_6$, $C_4F_8$, $O_2$, $CHF_3$, or the like (while forming protective films on the side walls). If using a method based on repeated etching and protective film formation, the etching conditions should be varied. In other words, by shortening the etching time, lengthening the protective film formation time, or altering the etching conditions (lowering the RF output, changing the pressure and gas flow), as etching proceeds in the depth direction, the etching volume should be reduced as etching proceeds. Furthermore, in the case of a method using a mixed gas, if using a fluorine gas such as $SF_6$, and oxygen, or a CF type of mixed gas, it is possible to control the angle of taper by altering the etching conditions, for instance, by changing the gas mixture ratio, changing the applied bias power, or the like. By adopting taper-shaped trench sections 112A of this kind, a merit is obtained in that good coverage is achieved when forming the protective films.

Figure 8:
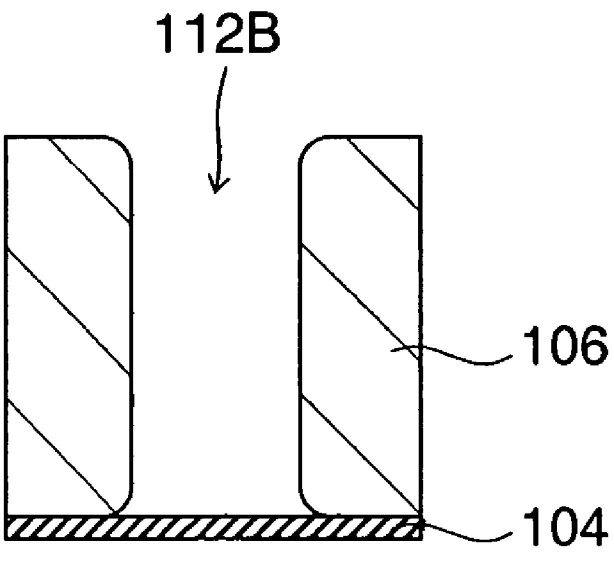
FIG. 8 is an illustrative diagram showing a second modification of the first embodiment.

FIG. 8 is an illustrative diagram showing a second modification of the first embodiment. As shown in FIG. 8, the trench sections 112B according to the present modification are composed with a curved radius shape at both the ends on the opening side and the ends on the bottom face side opposing the ends on the opening side. Furthermore, it is also possible to form either of these end portions with a radius shape. The method of forming the trench sections 112B having end portions composed with a radius shape in this way may be a method in which the steps of etching and forming protective films are repeated, over-etching is implemented to continue the etching process after reaching the box layer 104 (etching stop layer), and the notches generated in this etching process are used to form radius shapes in the end portions on the bottom face side of each trench section 112B. Furthermore, in the case of the radius shape in the end portions on the opening side, if a method is adopted which uses the repeated steps of etching and forming protective films, then etching should be carried out under conditions where the amount of etching is increased at the start of etching of each trench section 112B. The conditions for increasing the amount of etching may include, for instance: lengthening the etching time, increasing the flow rate of $SF_6$ gas, or raising the RF power. By adopting trench sections 112B composed in such a manner that at least one of the end portions, on either the opening side or the bottom face side, has a radius shape, the end portion of the pressure chambers 52 has a radius shape, and therefore the air bubble expulsion characteristics are improved.

Figure 9:
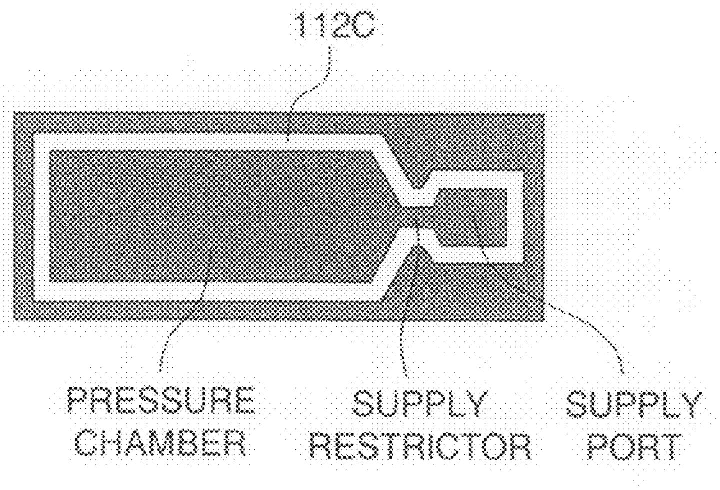
FIG. 9 is an illustrative diagram showing a third modification of the first embodiment.

Furthermore, in the present embodiment, as shown in FIG. 3D, the planar shape of the ring-shaped trench sections 112 is depicted as being a rectangular shape corresponding to the outline shape of the pressure chambers 52 as an example, but the implementation of the present invention is not limited to this. FIG. 9 is an illustrative diagram showing a third modification of the first embodiment. As shown in FIG. 9, the trench section 112C according to the present modification has a partially constricted shape, in which the section of large surface area surrounded by the trench section 112C corresponds to a pressure chamber, the portion of small surface area surrounded by the trench section 112C corresponds to a supply port, and the constricted section between these corresponds to a supply restrictor. By adopting a trench section 112C of this kind, it is possible to form the pressure chamber, the supply port and the supply restrictor together in the same operation.

According to the method of manufacturing a recording head 50 according to the present embodiment, the diaphragm 64 and the piezoelectric elements 58 are formed before forming the pressure chambers 52, and therefore it is possible to form the piezoelectric elements 58 to high accuracy without giving rise to warping of the diaphragm 64, even if the diaphragm 64 is thin. Furthermore, when the pressure chambers 52 are formed by etching of the active layer 106, then since the box layer 104 acts as an etching stop layer, surface irregularities do not occur in the bottom face of each pressure chamber 52 and therefore the pressure chambers 52 having a uniform depth can be formed. Furthermore, the outline shapes (side faces) of the pressure chambers 52 are defined with good accuracy by means of the trench sections 112 which are formed before forming the diaphragm 64. Consequently, it is possible to form the pressure chambers 52 with good accuracy.

Furthermore, by using the SOI substrate 100, it is possible to set the depth of the pressure chambers 52 freely in accordance with the thickness of the active layer 106, and handling characteristics and production yield are improved. Moreover, it is also possible to form the nozzle flow channels 56 along with the pressure chambers 52.

Furthermore, by selecting the material of the protective film 120 appropriately, it is also possible to use the protective film 120 which is filled into the interiors of the trench sections 112, as a protective film having ink resistant properties. Furthermore, there is freedom in the selection of the material used for the diaphragm 64.

Second Embodiment

Next, a second embodiment of the present invention is described below. Below, the parts of the second embodiment which are common to those of the first embodiment are not described, and the explanation focuses on the characteristic features of the present embodiment.

Figure 10A:
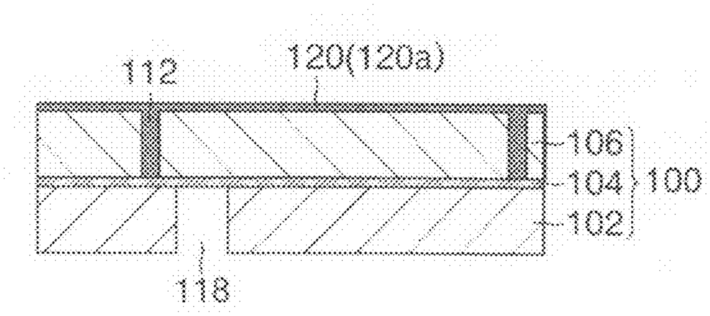
FIGS. 10A and 10B are illustrative diagrams showing steps of manufacturing a recording head according to a second embodiment of the invention.
Figure 10B:
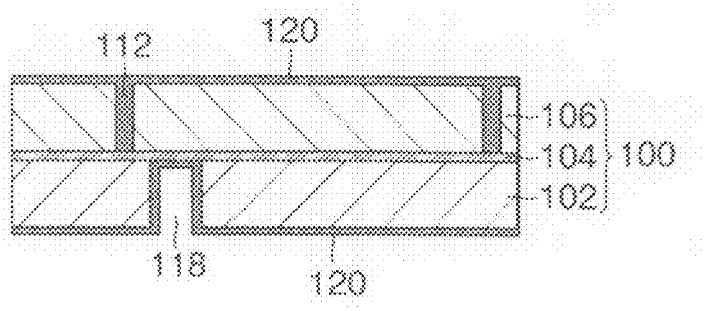

FIGS. 10A and 10B are illustrative diagrams showing a portion of a method of manufacturing a recording head 50 according to a second embodiment. In FIGS. 10A and 10B, the portions which are the same as FIGS. 3A to 5F are labelled with the same reference numerals and further description thereof is omitted here. In the present embodiment, as shown in FIG. 10A, after forming trench sections 112 in the active layer 106 and forming groove sections 118 in the supporting layer 102 similarly to the first embodiment (see FIG. 3H), a protective film 120, such as an oxide film or a nitride film, is formed on the upper surface side of the SOI substrate 100 by means of thermal oxidation, plasma oxidation, a nitriding process, P-CVD, LP-CVD, or the like. In this, in addition to the surface of the active layer 106, the interiors of the trench sections 112 are also buried without gaps by the protective film 120. For the protective film 120, it is possible to use SiOx, SiNx, SiON, SiCN, SiOC, or the like. The protective film 120 may be a single-layer film or a multiple-layer film. Subsequently, as shown in FIG. 10B, a protective film 120, such as an oxide film or a nitride film, is formed by a similar method to that described above, on the lower surface of the SOI substrate 100. The sequence of the steps in FIGS. 10A and 10B may also be reversed.

The protective film 120*a* on the surface of the active layer 106 functions as the diaphragm 64. Therefore, a new step for forming the diaphragm 64 is not required, and it is possible to condense the manufacturing process. The steps after formation of the protective film 120 are similar to those in the first embodiment.

Third Embodiment

Next, a third embodiment of the present invention is described below. Below, the parts of this embodiment which are common to those of the embodiments detailed above are not described, and the explanation focuses on the characteristic features of the present embodiment.

FIGS. 11A to 11H and FIGS. 12A to 12J are illustrative diagrams showing a method of manufacturing a recording head 50 according to a third embodiment. In FIGS. 11A to 11H and FIGS. 12A to 12J, the portions which are the same as FIGS. 3A to 5F are labelled with the same reference numerals and further description thereof is omitted here. In the first embodiment, the groove sections 118 are formed on the lower surface, which is opposite to the upper surface of the SOI substrate 100, before forming the diaphragm 64 and the piezoelectric elements 58 on the upper surface of the SOI substrate 100, whereas the present embodiment differs from the first embodiment in that the groove sections 118 are formed after forming the diaphragm 64 and the piezoelectric elements 58. Below, the manufacture method according to the present embodiment is described with reference to FIGS. 11A to 11H and FIGS. 12A to 12J.

Figure 11A:
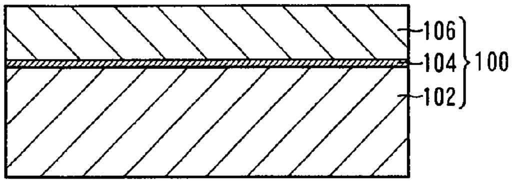
FIGS. 11A to 11H are illustrative diagrams showing steps of manufacturing a recording head according to a third embodiment of the invention.

Firstly, as shown in FIG. 11A, an SOI substrate 100 comprising a supporting layer (Si) 102, a box layer ($SiO_2$) 104 and an active layer (Si) 106, is prepared. The present embodiment is described with respect to a case where the supporting layer 102 is composed to a greater thickness than in the first embodiment, as an example.

Figure 11B:
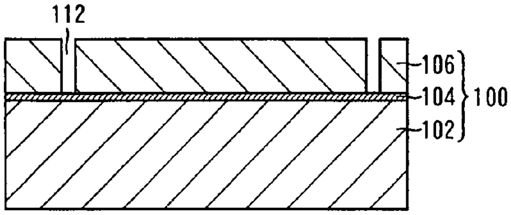
Figure 11C:
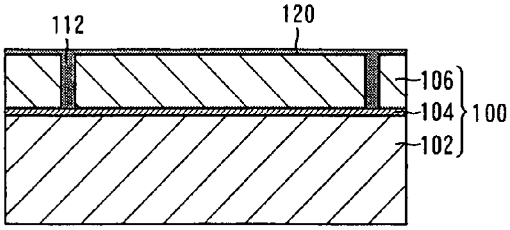

Next, as shown in FIG. 11B, ring-shaped trench sections 112 corresponding to the outline shape of the pressure chambers 52 are formed in the active layer 106. The concrete forming method is similar to that of the first embodiment (see FIGS. 3A to 3E), and after patterning a resist of a prescribed shape on the surface of the active layer 106, dry etching is carried out using the box layer 104 as an etching stop layer, thereby forming ring-shaped trench sections 112 having a bottom surface constituted by the box layer 104, in the active layer 106.

Next, as shown in FIG. 1C, a protective film 120 is formed on the upper surface side of the SOI substrate 100 (the side of the active layer 106). In this, in addition to the surface of the active layer 106, the protective film 120 is also formed inside the trench sections 112 without creating any gaps. The method of forming the protective film 120 may involve forming a protective film 120 such as an oxide film or a nitride film, by means of thermal oxidation, P-CVD, LP-CVD, sputtering, vapor deposition, plasma oxidation, a nitriding process or the like. Alternatively, it is also possible to use a combination of these methods. The thickness of the protective film 120 may be set as desired.

Figure 11D:
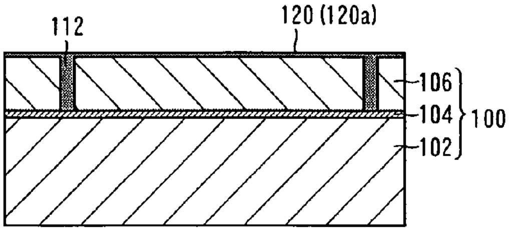

Next, as shown in FIG. 11D, according to requirements, the protective film 120*a* on the surface of the active layer 106 is leveled by means of polishing, CMP, plasma leveling, or another method. Alternatively, it is also possible to remove all of the protective film 120*a* on the surface of the active layer 106 by means of the leveling step.

Figure 11E:
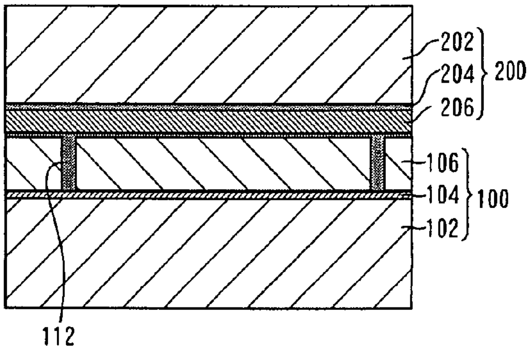
Figure 11F:
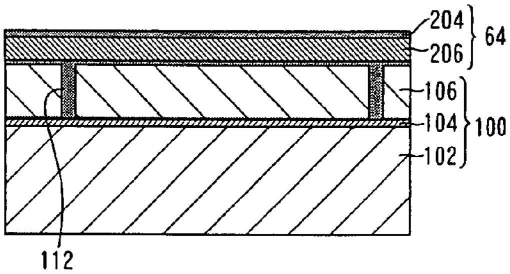

Next, as shown in FIG. 11E, a SOI substrate 200 comprising a supporting layer (Si) 202, a box layer ($SiO_2$) 204 and an active layer 206, is bonded onto the SOI substrate 100. In this case, the substrates are bonded together in such a manner that the active layers 106 and 206 face each other. The bonding method adopted may be anodic bonding, diffusion bonding, room-temperature bonding, or the like. After bonding together the SOI substrate 100 and the SOI substrate 200, the supporting layer 202 is removed. The method used to remove the supporting layer 202 may be wet etching, dry etching, polishing, CMP, or the like, and it is also possible to use a combination of these methods. By removing this supporting layer 202, as shown in FIG. 11F, the box layer 204 and the active layer 206 remaining on the upper surface of the SOI substrate 100 form the diaphragm 64. In the present embodiment, a method is described which forms the diaphragm 64 by using another SOI substrate 200, but similarly to the first embodiment, there are also modes in which a diaphragm 64 is deposited on the upper surface of the SOI substrate 100 by means of sputtering, vacuum deposition, CVD, or another method.

Figure 11G:
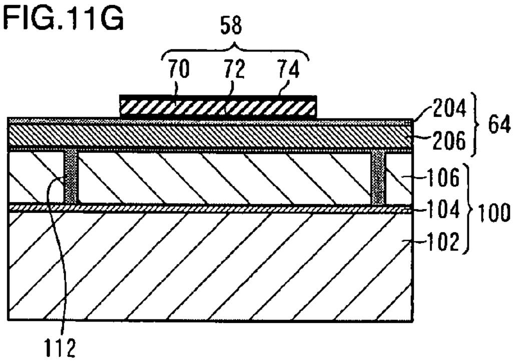

As shown in FIG. 11G, each of the piezoelectric elements 58 is formed by successively repeating the steps of depositing and patterning a lower electrode (common electrode) 72, a piezoelectric body 70 and a lower electrode (individual electrode) 74 onto the diaphragm 64.

Figure 11H:
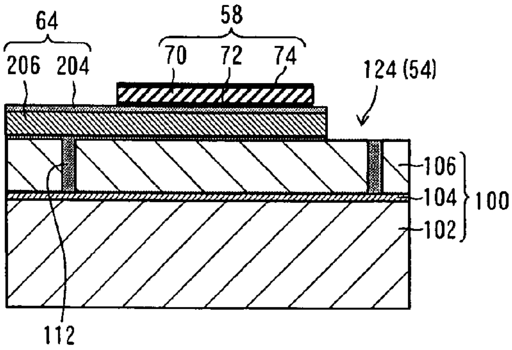
Figure 12A:
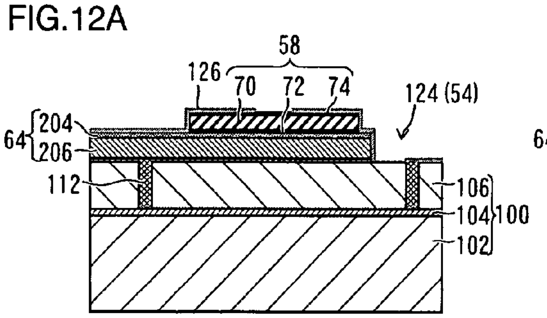
FIGS. 12A to 12J are illustrative diagrams showing steps of manufacturing a recording head according to the third embodiment of the invention.

Thereupon, as shown in FIG. 11H, opening sections 124 which correspond to the supply ports 54 are formed in the diaphragm 64, and portions of the inside region of the active layer 106 which are surrounded by the ring-shaped trench sections 112 are exposed. The concrete method is similar to that in the first embodiment (see FIG. 5A), the following processes being carried out in sequence: resist coating, prebaking, exposure, development, and post-baking. Thereupon, as shown in FIG. 12A, similarly to the first embodiment (see FIG. 5C), an insulating protective film 126, such as an oxide film, nitride film, or the like, is deposited and patterned on the upper surface side of the SOI substrate 100 (the side of the active layer 106), in other words, on the surface where the piezoelectric elements 58 are formed.

Figure 12B:
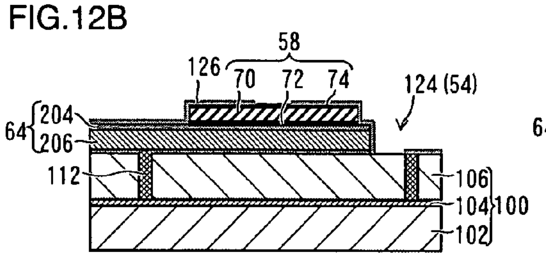

Next, the thickness of the supporting layer 102 is reduced, according to requirements, as shown in FIG. 12B. For example, the thickness of the supporting layer 102 should be adjusted to a prescribed thickness, by means of polishing, etching, CMP, plasma leveling, or another method.

Figure 12C:
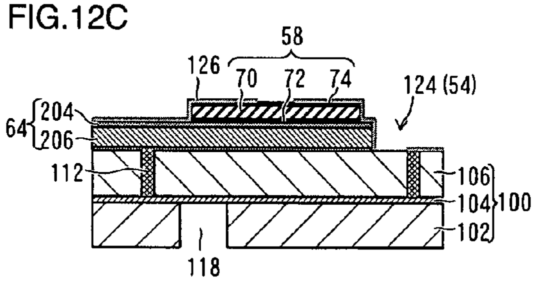

Next, as shown in FIG. 12C, a resist (not illustrated) is patterned onto the lower surface of the SOI substrate 100 (the side of the supporting layer 102), as a mask, and dry etching is carried out using the box layer 104 as an etching stop layer, thereby forming the groove sections 118 which correspond to nozzle flow channels 56. After forming the groove sections 118, the resist is removed.

Figure 12D:
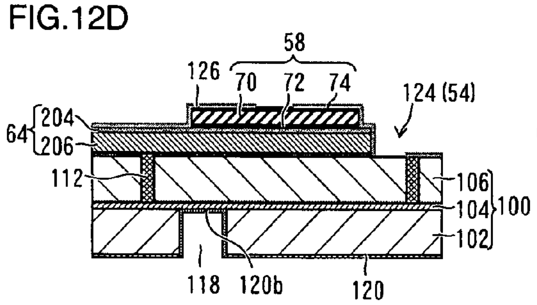

Thereupon, as shown in FIG. 12D, a protective film 120 is formed on the lower surface side of the SOI substrate 100. The method of forming the protective film 120 involves forming the protective film 120, such as an oxide film, nitride film, or the like, by means of thermal oxidation, plasma oxidation, a nitriding process, P-CVD, LP-CVD, or another method. For the protective film 120, it is possible to use SiOx, SiNx, SiON, SiCN, SiOC, or the like. The protective film 120 may be a single-layer film or a multiple-layer film.

Figure 12E:
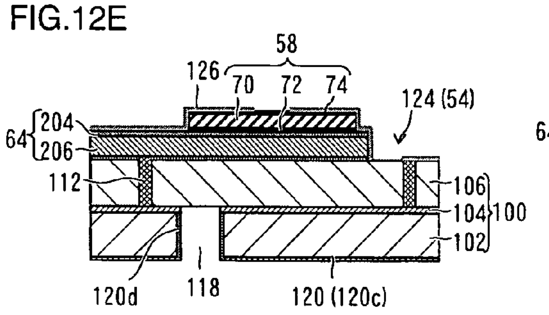

Thereupon, the protective film 120*b* and the box layer 104 on the bottom face of the groove sections 118, are removed by dry etching from the lower surface side of the SOI substrate 100. FIG. 12E shows a state after this removal step. The protective film 120*b* on the bottom face of each groove section 118 is thinner than the protective film 120*c* on the surface of the supporting layer 102, and therefore an etching selection ratio can be achieved. In this case, the protective layer 120*d* on the side faces of the groove sections 118 is not etched.

Figure 12F:
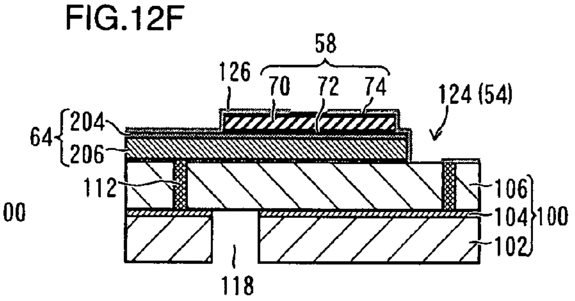
Figure 12G:
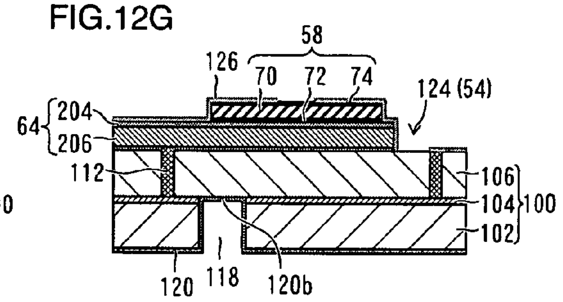
Figure 12H:
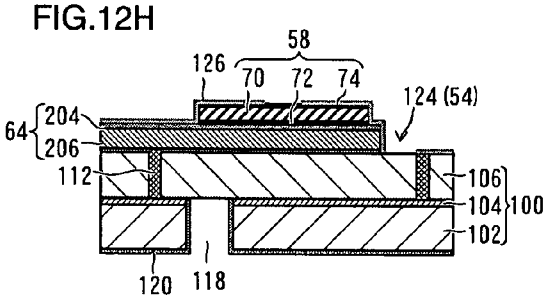

Instead of the sequence of steps shown in FIGS. 12D and 12E, firstly, as shown in FIG. 12F, it is also possible to remove the box layer 104 at the bottom face of the groove sections 118, from the lower surface side of the SOI substrate 100, to then form a protective film 120 on the lower surface side of the SOI substrate 100, as shown in FIG. 12G, and finally, to remove the protective film 120*b* on the bottom face of the groove sections 118 by dry etching, as shown in FIG. 12H. However, the sequence of steps shown in FIGS. 12D and 12E allows the protective film 120*b* and the box layer 104 on the bottom face of the groove sections 118 to be removed in the same step, and is therefore desirable in that it allows the manufacturing process to be condensed.

Figure 12I:
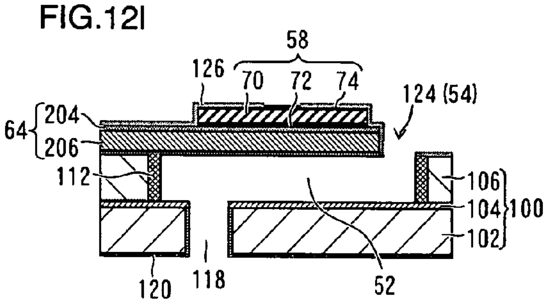

Thereupon, as shown in FIG. 12I, etching is carried out on the active layer 106 via each of the opening sections 124, thereby forming pressure chambers 52. The etching method used may be an anisotropic etching method, for example, plasma etching using $SF_6$ or the like, or gas reaction etching using $XeF_2$, or the like.

Figure 12J:
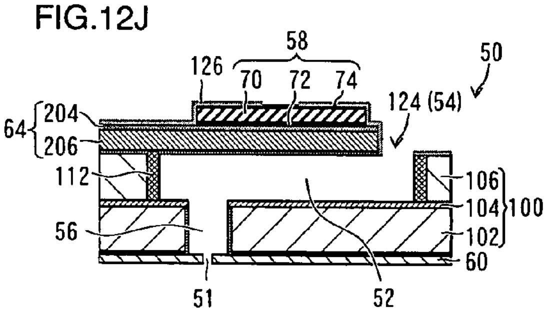

Finally, as shown in FIG. 12J, by bonding a separately manufactured nozzle plate 60 onto the lower surface side of the SOI substrate 100 by means of anodic bonding, eutectic bonding, normal temperature bonding, welding, or the like, the recording head 50 is completed.

In the method of manufacturing a recording head 50 according to the third embodiment, the diaphragm 64 and the piezoelectric elements 58 are formed on the upper surface side of the SOI substrate 100 (the side of the active layer 106), whereupon the groove sections 118 (which correspond to the nozzle flow channels 56) are formed on the lower surface side opposite to the upper surface. Consequently, it is possible to form the diaphragm 64 and piezoelectric elements 58 in a state where there are no undulations on the lower surface of the SOI substrate 100, and to improve handling characteristics and form the piezoelectric elements 58 with good accuracy accordingly.

Fourth Embodiment

Next, a fourth embodiment of the present invention is described below. Below, the parts of this embodiment which are common to those of the embodiments detailed above are not described, and the explanation focuses on the characteristic features of the present embodiment.

FIGS. 13A to 13F are illustrative diagrams showing a method of manufacturing a recording head 50 according to the fourth embodiment. In FIGS. 13A to 13F, the portions which are the same as FIGS. 3A to 5F are labelled with the same reference numerals and further description thereof is omitted here. In the present embodiment, a heater electrode is provided inside the trench sections 112. Below, the manufacture method according to the present embodiment is described with reference to FIGS. 13A to 13F.

Figure 13A:
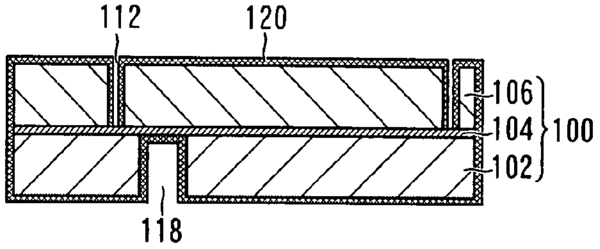
FIGS. 13A to 13F are illustrative diagrams showing steps of manufacturing a recording head according to a fourth embodiment of the invention.

Firstly, as shown in FIG. 13A, after forming the trench sections 112 in the active layer 106 and forming the groove sections 118 in the supporting layer 102 similarly to the first embodiment (see FIGS. 3A to 3I), a protective film 120 is formed on the whole surface of the SOI substrate 100, by means of thermal oxidation. However, in the present embodiment, it is necessary to form a prescribed gap inside each trench section 112, rather than burying each trench section 112 with the protective film 120, and the trench sections 112 are formed to a broad width in comparison with the first embodiment, for example.

Figure 13B:
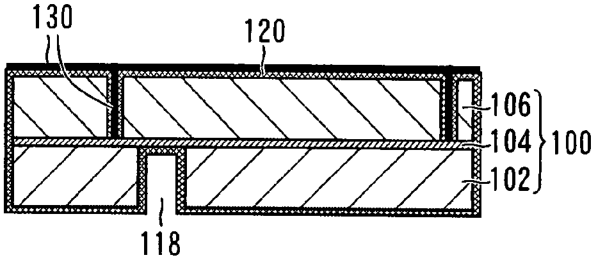

Next, as shown in FIG. 13B, a metal film 130 composed of a heater electrode material is deposited onto the upper surface of the SOI substrate 100 (the side of the active layer 106), by sputtering, vapor deposition, CVD, plating, or another method. In this case, the metal film 130 is formed in such a manner that the gaps inside the trench sections 112 are buried.

Figure 13C:
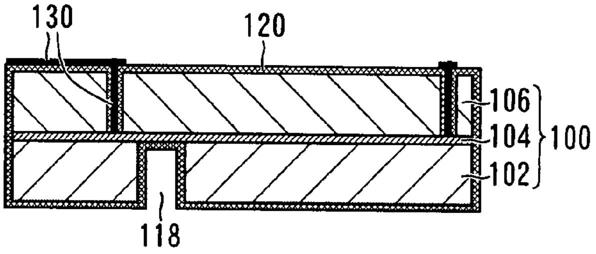

Next, as shown in FIG. 13C, the metal film 130 is patterned. More specifically, resist is patterned by successively carrying out the processes of resist coating, pre-baking, exposure, development, and post-baking, whereupon the metal film 130 is patterned to a prescribed shape by means of etching, using the resist as a mask.

Figure 13D:
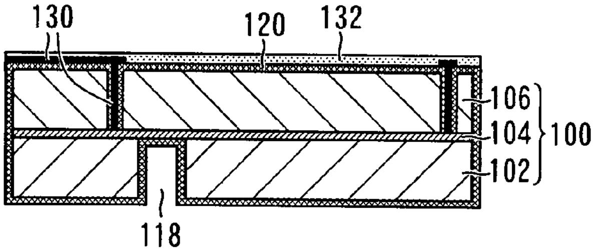
Figure 13E:
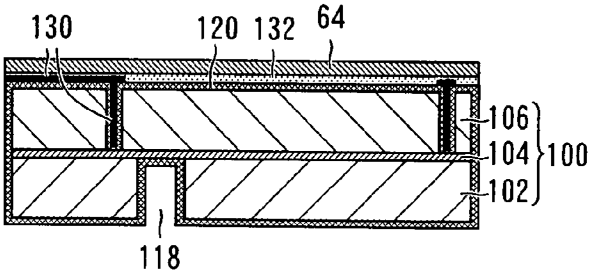
Figure 13F:
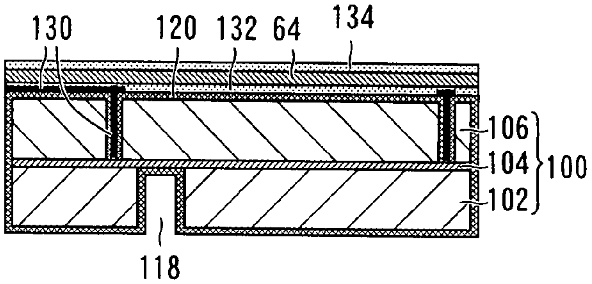

Thereupon, as shown in FIG. 13D, an insulating film 132 is formed on the upper surface of the SOI substrate 100. More specifically, an oxide film, nitride film, or the like, forming the insulating film 132 is deposited by sputtering, vapor deposition, CVD, or the like. Subsequently, as shown in FIG. 13E, the diaphragm 64 is formed by depositing a diaphragm material by means of sputtering, vapor deposition, CVD, or another method, onto the insulating film 132 formed on the upper surface of the SOI substrate 100. Moreover, as shown in FIG. 13F, an oxide film, nitride film, or the like, which is to form an insulating film 134, is deposited onto the diaphragm 64. The subsequent steps are similar to those of the first embodiment.

According to the method of manufacturing a recording head 50 according to the fourth embodiment, by forming the heater electrodes inside the trench sections 112, the temperature of the pressure chambers 52 can be adjusted and therefore it becomes possible to achieve the stable ejection.

Methods of manufacturing a liquid ejection head and image forming apparatuses according to the present invention have been described in detail above, but the present invention is not limited to the aforementioned examples, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a liquid ejection head, comprising the steps of:

forming a groove section in a first layer of a substrate including at least the first layer and a second layer, the groove section having a bottom face constituted by the second layer and being formed in a ring shape;

forming a protective film on the groove section;

forming a diaphragm on a surface of the first layer where the groove section is opened;

forming a piezoelectric element on the diaphragm;

forming an opening section in the diaphragm so as to expose a portion of a region of the first layer surrounded by the groove section; and etching the first layer via the opening section so as to form a pressure chamber, using the second layer as an etching stop layer.

2. The method of manufacturing a liquid ejection head as defined in claim 1, wherein the substrate is an SOI substrate.

3. The method of manufacturing a liquid ejection head as defined in claim 1, wherein the protective film and the diaphragm are made of a same material.

4. The method of manufacturing a liquid ejection head as defined in claim 1, wherein a sectional shape of the groove section parallel to a depth direction of the groove section is a tapered shaped which narrows in width from an opening side of the groove section toward a bottom face side of the groove section.

5. The method of manufacturing a liquid ejection head as defined in claim 1, wherein a sectional shape of the groove section parallel to a depth direction of the groove section comprises a radius-shaped end portion on at least one of an opening side and a bottom face side of the groove section.

6. The method of manufacturing a liquid ejection head as defined in claim 1, further comprising the step of forming a heater electrode in the groove section.

7. An image forming apparatus comprising the liquid ejection head manufactured by the method of manufacturing a liquid ejection head as defined in claim 1.

* * * * *